United States Patent
Cao

(10) Patent No.: US 10,784,326 B2
(45) Date of Patent: Sep. 22, 2020

(54) OLED DISPLAY PANEL AND DISPLAY DEVICE

(71) Applicant: Wuhan China Star Optoelectronics Semiconductor Display Technology Co., Ltd., Wuhan, Hubei (CN)

(72) Inventor: Xuwen Cao, Wuhan (CN)

(73) Assignee: Wuhan China Star Optoelectronics Semiconductor Display Technology Co., Ltd., Wuhan, Hubei (CN)

(*) Notice: Subject to any disclaimer, the term of this patent is extended or adjusted under 35 U.S.C. 154(b) by 0 days.

(21) Appl. No.: 15/746,539

(22) PCT Filed: Jan. 5, 2018

(86) PCT No.: PCT/CN2018/071491
§ 371 (c)(1),
(2) Date: Jan. 22, 2018

(87) PCT Pub. No.: WO2019/114062
PCT Pub. Date: Jun. 20, 2019

(65) Prior Publication Data
US 2019/0181206 A1    Jun. 13, 2019

(30) Foreign Application Priority Data
Dec. 13, 2017    (CN) .......................... 2017 1 1324406

(51) Int. Cl.
*H01L 27/32*    (2006.01)
*H01L 51/50*    (2006.01)
(Continued)

(52) U.S. Cl.
CPC ........ *H01L 27/3262* (2013.01); *G06F 3/0412* (2013.01); *G06F 3/0445* (2019.05); *H01L 27/3276* (2013.01); *H01L 51/5056* (2013.01); *H01L 51/5072* (2013.01); *H01L 51/5092* (2013.01); *H01L 51/5212* (2013.01); *H01L 51/5221* (2013.01); *H01L 27/323* (2013.01)

(58) Field of Classification Search
CPC ............. H01L 27/3262; H01L 51/5092; H01L 51/5221; H01L 51/5072; H01L 51/5056; H01L 51/5212; H01L 27/323; H01L 27/3269; G06F 3/0412; G06F 3/0445
See application file for complete search history.

(56) References Cited

U.S. PATENT DOCUMENTS

2015/0042614 A1* 2/2015 Pak .......................... G06F 3/044
345/174
2016/0322429 A1* 11/2016 Chen ....................... G06F 3/044
(Continued)

*Primary Examiner* — Latanya N Crawford Eason
(74) *Attorney, Agent, or Firm* — Mark M. Friedman

(57) ABSTRACT

The present invention provides an organic light-emitting diode display panel including a substrate, a thin film transistor arranged on the substrate, a planarization layer arranged on the substrate, a first touch electrode arranged on a surface of the planarization layer, an electrode insulation layer arranged on the surface of the planarization layer, a metal anode arranged on a surface of the electrode insulation layer and electrically connected to the source electrode or the drain electrode of the thin film transistor, and, a second touch electrode arranged on the surface of the electrode insulation layer and electrically connected to the first touch electrode.

15 Claims, 3 Drawing Sheets

(51) Int. Cl.
    *H01L 51/52*     (2006.01)
    *G06F 3/041*     (2006.01)
    *G06F 3/044*     (2006.01)

(56) References Cited

U.S. PATENT DOCUMENTS

| | | | |
|---|---|---|---|
| 2017/0213873 A1* | 7/2017 | Bok | H01L 27/323 |
| 2017/0324058 A1* | 11/2017 | Min | H01L 51/524 |
| 2017/0357349 A1* | 12/2017 | Won | G06F 3/044 |
| 2018/0069068 A1* | 3/2018 | Ka | H02S 40/44 |
| 2018/0143729 A1* | 5/2018 | Lee | G06F 3/0416 |
| 2018/0190720 A1* | 7/2018 | Yueh | G06F 3/0416 |
| 2018/0342707 A1* | 11/2018 | Lee | H01L 51/56 |

\* cited by examiner

OLED DISPLAY PANEL AND DISPLAY DEVICE

CROSS REFERENCE TO RELATED APPLICATION

This application claims the priority of International Application No. PCT/CN2018/071491, filed on 2018 Jan. 5, which claims priority to Chinese Application No. 201711324406.5, filed on 2017 Dec. 13. The entire disclosures of each of the above applications are incorporated herein by reference.

BACKGROUND OF INVENTION

Field of Invention

The present invention relates to a field of display technology, and particularly relates to an OLED display panel and a display device comprising the OLED display panel.

Description of Prior Art

Organic light-emitting diodes (OLEDs) are self-luminous, have high brightness, wide viewing angles, high contrast, flexible, and have low energy consumption, etc, which make wide application prospects. As a new generation of displays, organic light-emitting diodes have gradually begun to replace traditional liquid crystal displays and are widely used in mobile phone screen, computer monitors, and color TV, etc. OLED display technology is different from traditional liquid crystal display technology, which needs no backlighting and uses very thin organic material coating and glass substrate. When current passes, these organic materials glow. The OLED display has many advantages including being a flexible display. As a flexible display, a flexible OLED panel can be obtained if a flexible plastic substrate is used as a carrier and further cooperates with a film packaging process. Subthreshold swing of the thin film transistor depends on size of the gate capacity, and the size of the gate capacity depends on thickness of gate dielectric, thus the subthreshold swing of driving thin film transistor can be improved by increasing the thickness of gate dielectric, to improve gray level switching performance of the display panel.

Thin displays are a trend. The OLED displays are more competitive due to their thinner thickness compared with liquid crystal displays (LCDs). In displays that combine a display screen with a touch screen, in-cell displays are getting more and more attention because of their thinner thickness compared with On-cell displays.

In existing in-cell touch displays, multiple electrode layers need to be used when a touch circuit is added onto film layers of an OLED display panel, resulting in a relatively complex production process and longer production time.

SUMMARY OF INVENTION

The application provides an OLED display panel, which has an in-cell touch panel and a relatively simple production process, solving the technical problem that multiple electrode layers need to be used when a touch circuit is added onto film layers of an OLED display panel in existing in-cell touch displays, thus making a relatively complex production process and affecting production time.

For the above-mentioned objective, the present disclosure employs the following technical schemes.

An OLED display panel, comprising: a substrate and a plurality of pixel units arranged on a surface of the substrate;
each of the pixel units includes
a thin film transistor arranged on the substrate, wherein the thin film transistor includes a source electrode, a drain electrode and a gate electrode;
a planarization layer arranged on the substrate and covering the thin film transistor;
a first touch electrode arranged on a surface of the planarization layer;
an electrode insulation layer arranged on the surface of the planarization layer and covering the first touch electrode;
a metal anode arranged on a surface of the electrode insulation layer and electrically connected to the source electrode or the drain electrode of the thin film transistor; and,
a second touch electrode arranged on the surface of the electrode insulation layer and electrically connected to the first touch electrode, wherein the first touch electrode and the second touch electrode are arranged in an area between two adjacent pixel units;
a light-emitting device arranged on a surface of the pixel electrode metal anode; and
a metal cathode arranged on a surface of the light-emitting device.

In one exemplary embodiment, in the OLED display panel, a metal through-hole is formed through the planarization layer and the electrode insulation layer; the metal anode is connected to the source electrode or the drain electrode of the thin film transistor via the metal through-hole.

In one exemplary embodiment, in the OLED display panel, wherein a metal material filled in the metal through-hole is same as a material of the metal anode.

In one exemplary embodiment, in the OLED display panel, a first metal through-hole is formed through the planarization layer; a metal line is prepared on a surface of the first metal through-hole; the metal line is connected to the source electrode or the drain electrode of the thin film transistor via the first metal through-hole;
a second metal through-hole above the metal line is formed through the electrode insulation layer; the metal anode is connected to the metal line via the second metal through-hole and further connected to the source electrode or the drain electrode of the thin film transistor.

In one exemplary embodiment, in the OLED display panel, both the metal line and the first touch electrode are made of a same material and prepared simultaneously.

In one exemplary embodiment, in the OLED display panel, the first touch electrodes and the second touch electrodes form at least one rhombic grid, which is distributed on the surface of the planarization layer.

In one exemplary embodiment, in the OLED display panel, a bounding area is arranged on the surface of the substrate; a driving chip is arranged in the bounding area; a display control circuit and a touch control circuit are integrated in the driving chip; wherein the display control circuit is connected to the thin film transistor, and the touch control circuit is connected to the first touch electrodes and the second touch electrodes.

In one exemplary embodiment, in the OLED display panel, the first touch electrode is prepared from at least one metal material selected from a group consisting of Al, Mg, and Ca; the second touch electrode is prepared from a material of indium tin oxide.

An OLED display panel, comprising: a substrate and a plurality of pixel units arranged on a surface of the substrate;
each of the pixel units includes a thin film transistor arranged on the substrate, wherein the thin film transistor includes a source electrode, a drain electrode and a gate electrode;

a planarization layer arranged on the substrate and covering the thin film transistor;

a first touch electrode arranged on a surface of the planarization layer;

an electrode insulation layer arranged on the surface of the planarization layer and covering the first touch electrode;

a metal anode arranged on a surface of the electrode insulation layer and electrically connected to the source electrode or the drain electrode of the thin film transistor; and, a second touch electrode arranged on the surface of the electrode insulation layer and electrically connected to the first touch electrode;

a light-emitting device arranged on a surface of the pixel electrode metal anode; and a metal cathode arranged on a surface of the light-emitting device.

In one exemplary embodiment, in the OLED display panel, a metal through-hole is formed through the planarization layer and the electrode insulation layer; the metal anode is connected to the source electrode or the drain electrode of the thin film transistor via the metal through-hole.

In one exemplary embodiment, in the OLED display panel, a metal material filled in the metal through-hole is same as a material of the metal anode.

In one exemplary embodiment, in the OLED display panel, a first metal through-hole is formed through the planarization layer; a metal line is prepared on a surface of the first metal through-hole;

a second metal through-hole above the metal line is formed through the electrode insulation layer; the metal anode is connected to the metal line via the second metal through-hole and further connected to the source electrode or the drain electrode of the thin film transistor.

In one exemplary embodiment, in the OLED display panel, both the metal line and the first touch electrode are made of a same material and prepared simultaneously.

In one exemplary embodiment, in the OLED display panel, the first touch electrodes and the second touch electrodes form at least one rhombic grid, which is distributed on the surface of the planarization layer.

In one exemplary embodiment, in the OLED display panel, a bounding area is arranged on the surface of the substrate; a driving chip is arranged in the bounding area; a display control circuit and a touch control circuit are integrated in the driving chip; wherein the display control circuit is connected to the thin film transistor, and the touch control circuit is connected to the first touch electrodes and the second touch electrodes.

In one exemplary embodiment, in the OLED display panel, the first touch electrode is prepared from at least one material selected from a group consisting of Al, Mg, and Ca; the second touch electrode is prepared from a material of indium tin oxide.

A display device, comprising the above OLED display panel.

The beneficial effect of this application is: in an OLED display panel of this application compared with existing in-cell touch displays, preparing a touch electrode and a metal anode of an OLED device in a same layer, saves the film production process of the touch electrode, further saves the production process time, and also reduces the thickness of the OLED display panel at the same time; solve the technical problem that multiple electrode layers need to be used when a touch circuit is added onto film layers of an OLED display panel in existing in-cell touch displays, thus making a relatively complex production process and affecting production time.

BRIEF DESCRIPTION OF DRAWINGS

In order to clearly describe the embodiment in the present disclosure or the prior art, the following will introduce the drawings for the embodiment shortly. Obviously, the following description is only a few embodiments, for a person of ordinary skill in the art, it is easy to acquire some other drawings without creative work.

DETAILED DESCRIPTION OF PREFERRED EMBODIMENTS

Figure 1:
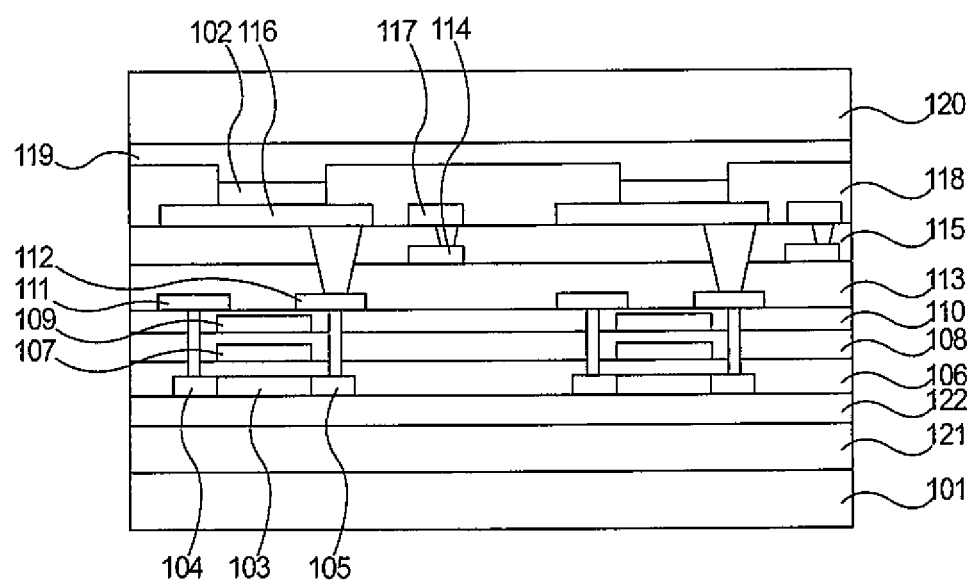
FIG. 1 is a structural diagram of film layers of an OLED display panel according to one exemplary embodiment of the present disclosure.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc, are only used with reference to the orientation of the accompanying drawings. Therefore, the used directional terms are intended to illustrate, but not to limit, the present disclosure. In the drawings, the components having similar structures are denoted by same numerals.

The application solves technical problems for existing display panels, where multiple electrode layers need to be used when a touch circuit is added onto film layers of an OLED display panel, making a relatively complex production process and affecting production time.

Referring to FIG. 1, an OLED display panel is provided in this application, comprising a substrate 101. A plurality of pixel units are distributed on a surface of the substrate 101. Each of the pixel units includes a thin film transistor arranged on the surface of the substrate 101, and a light-emitting device 102 arranged on the thin film transistor.

The thin film transistor includes an active layer, wherein the active layer includes a channel 103, a source electrode doped region 104 arranged on one side of the channel 103, and a drain electrode doped region 105 arranged on an opposite side of the channel 103. The thin film transistor further includes a first gate insulation layer 106 arranged on a surface of the active layer; a first gate electrode 107 arranged on a surface of the first gate insulation layer 106; a second gate insulation layer 108 arranged on a surface of the first gate insulation layer 106 and covering the first gate electrode 107; a second gate electrode 109 arranged on a surface of the second gate insulation layer 108; a spaced insulation layer 110 arranged on a surface of the second gate insulation layer 108 and covering the second gate electrode 109; and, a source electrode 111 and a drain electrode 112 arranged on a surface of the spaced insulation layer 110, wherein the source electrode 111 is connected to the source electrode doped region 104, and the drain electrode 112 is connected to the drain electrode doped region 105.

A planarization layer 113 is arranged on a surface of the spaced insulation layer 110, and covers the source electrode 111 and the drain electrode 112. A first touch electrode 114 is arranged on a surface of the planarization layer 113. An electrode insulation layer 115 is arranged on the surface of the planarization layer 113, and covers the first touch electrode 114. A metal anode 116 and a second touch electrode 117 are arranged on a surface of the electrode insulation layer 115, wherein the metal anode 116 is electrically connected to the source electrode 111 or the drain electrode 112, and the second touch electrode 117 is electrically connected to the first touch electrode 114.

Specifically, the metal anode 116 is connected to the source electrode 111 or the drain electrode 112 via a first metal through-hole. The first metal through-hole is formed through the electrode insulation layer 115 and the planarization layer 113. A material filled in the metal through-hole is same as a material of the metal anode 116, for example, the metal anode 116 is prepared from a material of indium tin oxide (ITO). The second touch electrode 117 can be prepared from the same material as the metal anode 116, thus making the metal anode 116 and the second touch electrode 117 to be prepared in a same process. The second touch electrode 117 is connected to the first touch electrode 114 by a second metal through-hole. The second metal through-hole is formed through the electrode insulation layer 115, and filled with the same material as the second touch electrode 117.

The first touch electrode 114 and the second touch electrode 117 are used to realize a touch control function of the display panel. The first touch electrode 114 is a driving electrode or an inductive electrode. When the first touch electrode 114 is used as the driving electrode, the second touch electrode 117 is used as the inductive electrode. When the second touch electrode 117 is used as the driving electrode, the first touch electrode 114 is used as the inductive electrode.

The first touch electrode 114 is located below the second touch electrode 117. A gap is formed between two adjacent metal anodes 116. The first touch electrode 114 and the second touch electrode 117 are arranged in the gap, thus avoiding the touch electrodes blocking a display area. At least one rhombic grid distributed on the surface of the planarization layer 113 is formed by the first touch electrodes 114 and the second touch electrodes 117, thus forming multiple rhombic touch areas.

A pixel defining layer 118 is arranged on the surface of the electrode insulation layer 115. The pixel defining layer 118 covers the metal anode 116 and the second touch electrode 117. Moreover, a pixel opening is formed in an area of the pixel defining layer 118 corresponding to the metal anode 116. The light-emitting device 102 is arranged in the pixel opening and on a surface of the metal anode 116. A metal cathode 119 is arranged on a surface of the pixel defining layer 118, contacting a surface of the light-emitting device 102 at the same time.

The light-emitting device 102 comprises: a hole injection layer arranged on the surface of the metal anode 116; a hole transporting layer arranged on a surface of the hole void injection layer; a luminescent layer arranged on a surface of the hole transporting layer; an electron transporting layer arranged on a surface of the luminescent layer; an electron injection layer arranged on a surface of the electron transporting layer. The metal cathode 119 is arranged on a surface of the electron injection layer.

A packaging layer 120 is arranged outside of the OLED display panel.

A resistive layer 121 is arranged on the surface of the substrate 101. A buffer layer 122 is arranged on a surface of the resistive layer 121. The active layer of the thin film transistor is arranged on a surface of the buffer layer 122.

A bounding area is arranged on the surface of the substrate 101, in which a driving chip is arranged. A display control circuit and a touch control circuit are integrated in the driving chip. The display control circuit is connected to the thin film transistor. The touch control circuit is connected to the first touch electrodes 114 and the second touch electrodes 117. In order to control data import to realize the screen display, the display control circuit is used to control the opening and closing of the thin film transistor. The touch control circuit is connected to the first touch electrode 114 and the second touch electrode 117. When a hand touches a screen, the capacitance of a touch area between the first touch electrode 114 and the second touch electrode 117 changes. The touch control circuit can calculate the coordinates of the touch area by detecting an area having a capacitance change, and then realizing touch control.

Figure 2:
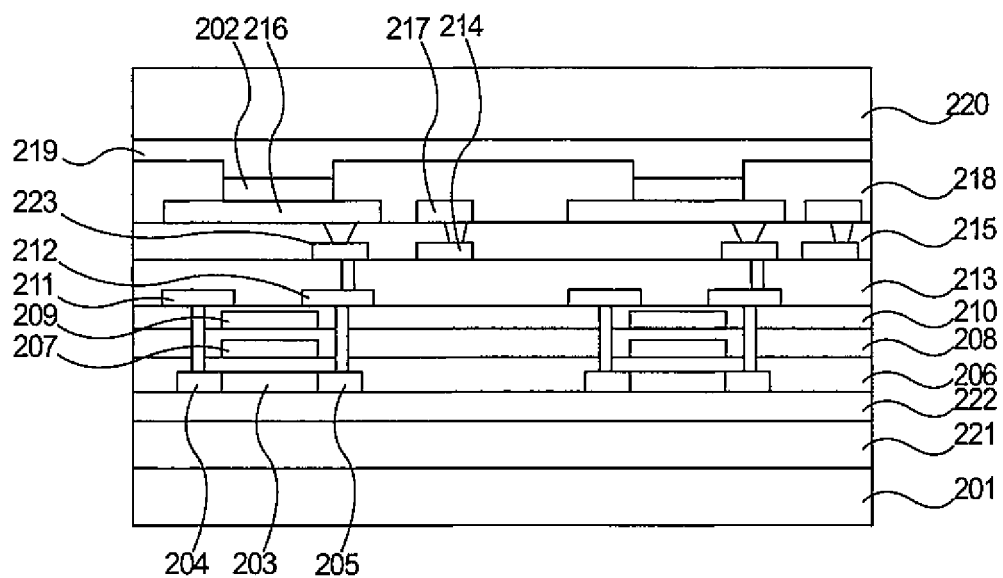
FIG. 2 is another structural diagram of film layers of an OLED display panel according to one exemplary embodiment of the present disclosure.

Referring to FIG. 2, an OLED display panel is provided in this application, comprising a substrate 201, a resistive layer 221 arranged on a surface of the substrate 201, a buffer layer 222 arranged on a surface of the resistive layer 221, and a thin film transistor arranged on a surface of the buffer layer 222. The thin film transistor includes an active layer, a first gate insulation layer 206, a first gate electrode 207, a second gate insulation layer 208, a second gate electrode 209, a spaced insulation layer 210, a source electrode 211 and a drain electrode 212. The active layer includes a channel 203, a source electrode doped region 204 arranged on one side of the channel 103, and a drain electrode doped region 205 arranged on an opposite side of the channel 203.

A planarization layer 213 is arranged on a surface of the thin film transistor. A first touch electrode 214 is arranged on a surface of the planarization layer 213. An electrode insulation layer 215 is arranged on the surface of the planarization layer 213 and first touch electrode 214. A metal anode 216 and a second touch electrode 217 are arranged on a surface of the electrode insulation layer 215. A pixel defining layer 218 is arranged on the surface of the electrode insulation layer 215, the metal anode 216, and the second touch electrode 217. A pixel opening is formed in the pixel defining layer 218, in which a light-emitting device 202 is arranged. A metal cathode 219 is arranged on a surface of the pixel defining layer 218 and the light-emitting device 202. A packaging layer 220 is arranged outside of the OLED display panel.

A resistive layer 221 is arranged on the surface of the substrate 201. A buffer layer 222 is arranged on a surface of the resistive layer 221. The active layer of the thin film transistor is arranged on a surface of the buffer layer 222.

Compared with FIG. 1, in FIG. 2, a first metal through-hole is formed through the planarization layer 213. A metal line 223 is prepared on a surface of the first metal through-hole, wherein the metal line is connected to the source electrode 211 or the drain electrode 212 of the thin film transistor via the first metal through-hole. A second metal through-hole above the metal line 223 is formed through the electrode insulation layer 215, wherein the metal anode 216 is connected to the metal line 223 via the second metal through-hole, and further connected to the source electrode 211 or the drain electrode 212 of the thin film transistor.

To overlap the metal anode 216 via the metal line 223, a hole needs to be dug in both the planarization layer 213 and the electrode insulation layer 215 to form a through-hole. Depth control precision of the through-hole is relatively high, and a connection between the metal anode 216 and the source electrode 211 or the drain electrode 212 is more stable. In addition, material of ITO filled in the through-hole has low conductivity, thus the connection between the metal anode 216 and the source electrode 211 or the drain electrode 212 can be further enhanced when the through-hole overlaps the metal line 223.

Figure 3:
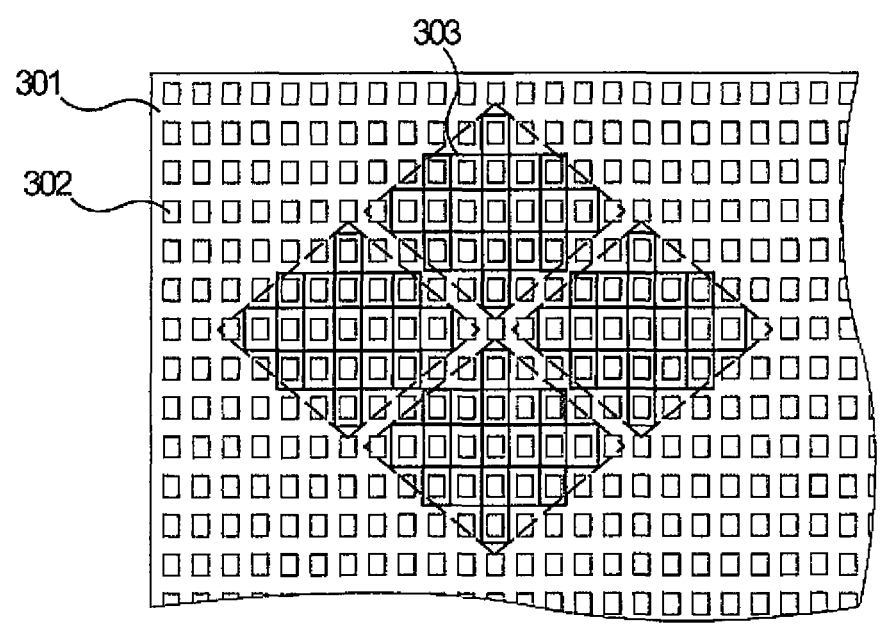
FIG. 3 is a distribution diagram of induced electrode lines of an OLED display panel according to one exemplary embodiment of the present disclosure.

Referring to FIG. 3, an OLED display panel is provided in this application, comprising an array substrate 301. A pixel defining layer is arranged on a surface of the array substrate 301. A pixel area and a touch-routing area are formed by patterning the pixel defining layer. A plurality of display pixels 302 are arranged in the pixel area. A plurality of touch electrodes 303 are arranged in the touch-routing area. The touch electrodes 303 include at least one first touch electrode and at least one second touch electrode.

The touch electrodes 303 form a plurality of mutually insulated rhombic grid metals. The pixel area is arranged in the rhombic grid metals, thus making an area between the pixel units be full used and without covering the display area, and then making at least one metal line with high electric conductivity to be used to keep the touch function of the OLED display panel run steadily.

The touch electrodes 303 form multiple groups of electrode patterns, and each group of electrode patterns includes four rhombic grid metals. The four rhombic grid metals in the same group of electrode patterns distribute as a cross.

According to the purpose of this application, a display device is provided, comprising the above OLED display panel.

A working principle of the OLED display device in this preferred embodiment is consistent with a working principle of the OLED display panel in above preferred embodiments, and can be consulted from the working principle of the OLED display panel in above preferred embodiments, thus without being repeated again here.

The beneficial effect of this application is that in an OLED display panel of this application compared with the existing in-cell touch display, preparing a touch electrode and a metal anode of an OLED device in a same layer, saves the film production process of the touch electrode, further saves the production process time, and also reduces the thickness of the OLED display panel at the same time; solve the technical problem that multiple electrode layers need to be used when a touch circuit is added onto film layers of the OLED display panel in existing in-cell touch display, thus making a relatively complex production process and affecting production time.

In conclusion, the present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:

1. An organic light-emitting diode display panel, wherein the OLED display panel comprises: a substrate and a plurality of pixel units arranged on a surface of the substrate; each of the pixel units includes
    a thin film transistor arranged on the substrate, wherein the thin film transistor includes:
        a source electrode doped region, over the substrate;
        a drain electrode doped region, over the substrate;
        a channel, connected between the source electrode doped region and the drain electrode doped region;
        a first gate, on a first gate insulation layer;
        a second gate, on a second gate insulation layer that covers the first gate insulation layer;
        a source electrode, on the second gate insulation layer and connected to the source electrode doped region; and
        a drain electrode, on the second gate insulation layer and connected to the drain electrode doped region;
    a planarization layer arranged on the substrate and covering the thin film transistor;
    a first touch electrode arranged on a surface of the planarization layer;
    an electrode insulation layer arranged on the surface of the planarization layer and covering the first touch electrode;
    a metal anode arranged on a surface of the electrode insulation layer and electrically connected to the source electrode or the drain electrode of the thin film transistor via a first metal through-hole, wherein the first metal through-hole is formed through the electrode insulation layer and the planarization layer; and,
    a second touch electrode arranged on the surface of the electrode insulation layer and electrically connected to the first touch electrode, wherein the first touch electrode and the second touch electrode are arranged in an area between two adjacent pixel units;
    a light-emitting device arranged on a surface of the metal anode; and
    a metal cathode arranged on a surface of the light-emitting device.

2. The OLED display panel as claimed in claim 1, wherein a metal material filled in the metal through-hole is same as a material of the metal anode.

3. The OLED display panel as claimed in claim 1, wherein a metal line is prepared on a surface of the first metal through-hole; the metal line is connected to the source electrode or the drain electrode of the thin film transistor via the first metal through-hole;
    a second metal through-hole above the metal line is formed through the electrode insulation layer; the metal anode is connected to the metal line via the second metal through-hole and further connected to the source electrode or the drain electrode of the thin film transistor.

4. The OLED display panel as claimed in claim 3 wherein both the metal line and the first touch electrode are made of a same material and prepared simultaneously.

5. The OLED display panel as claimed in claim 1, wherein the first touch electrodes and the second touch electrodes form at least one rhombic grid which is distributed on the surface of the planarization layer.

6. The OLED display panel as claimed in claim 1, wherein a bounding area is arranged on the surface of the substrate; a driving chip is arranged in the bounding area; a display control circuit and a touch control circuit are integrated in the driving chip; wherein the display control circuit is connected to the thin film transistor, and the touch control circuit is connected to the first touch electrodes and the second touch electrodes.

7. The OLED display panel as claimed in claim 1, wherein the first touch electrodes and the second electrodes are prepared from at least one material selected from a group consisting of Al, Mg, and Ca.

8. An organic light-emitting diode display panel, wherein the OLED display panel comprises: a substrate and a plurality of pixel units arranged on a surface of the substrate; each of the pixel units includes
    a thin film transistor arranged on the substrate, wherein the thin film transistor includes:
        a source electrode doped region, over the substrate;
        a drain electrode doped region, over the substrate;
        a channel, connected between the source electrode doped region and the drain electrode doped region;
        a first gate, on a first gate insulation layer;
        a second gate, on a second gate insulation layer that covers the first gate insulation layer;
        a source electrode, on the second gate insulation layer and connected to the source electrode doped region; and
        a drain electrode, on the second gate insulation layer and connected to the drain electrode doped region;
    a planarization layer arranged on the substrate and covering the thin film transistor;
    a first touch electrode arranged on a surface of the planarization layer;
    an electrode insulation layer arranged on the surface of the planarization layer and covering the first touch electrode;
    a metal anode arranged on a surface of the electrode insulation layer and electrically connected to the source electrode or the drain electrode of the thin film transistor via a first metal through-hole, wherein the first metal through-hole is formed through the electrode insulation layer and the planarization layer; and,
    a second touch electrode arranged on the surface of the electrode insulation layer and electrically connected to the first touch electrode;
    a light-emitting device arranged on a surface of the metal anode; and
    a metal cathode arranged on a surface of the light-emitting device.

9. The OLED display panel as claimed in claim 8 wherein a metal material filled in the metal through-hole is same as a material of the metal anode.

10. The OLED display panel as claimed in claim 8 wherein a metal line is prepared on a surface of the first metal through-hole;
    a second metal through-hole above the metal line is formed through the electrode insulation layer; the metal anode is connected to the metal line via the second metal through-hole and further connected to the source electrode or the drain electrode of the thin film transistor.

11. The OLED display panel as claimed in claim 10, wherein both the metal line and the first touch electrode are made of a same material and prepared simultaneously.

12. The OLED display panel as claimed in claim 8 wherein the first touch electrodes and the second touch electrodes form at least one rhombic grid, which is distributed on the surface of the planarization layer.

13. The OLED display panel as claimed in claim 8, wherein a bounding area is arranged on the surface of the substrate; a driving chip is arranged in the bounding area; a display control circuit and a touch control circuit are integrated in the driving chip; wherein the display control circuit is connected to the thin film transistor, and the touch control circuit is connected to the first touch electrodes and the second touch electrodes.

14. The OLED display panel as claimed in claim 8, wherein the first touch electrodes and the second electrodes are prepared from at least one material selected from a group consisting of Al, Mg, and Ca.

15. A display device, comprising an organic light-emitting diode display panel as claimed in claim 8.

* * * * *